United States Patent
Cohen et al.

(10) Patent No.: US 7,103,110 B2
(45) Date of Patent: Sep. 5, 2006

(54) DUAL PHASE PULSE MODULATION ENCODER CIRCUIT

(75) Inventors: Daniel S. Cohen, Baltimore, MD (US); John L. Fagan, Pasadena, MD (US); Mark A. Bossard, Upper Marlboro, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/836,703

(22) Filed: Apr. 29, 2004

(65) Prior Publication Data

US 2005/0078021 A1    Apr. 14, 2005

Related U.S. Application Data

(60) Provisional application No. 60/510,738, filed on Oct. 10, 2003.

(51) Int. Cl.
H04L 27/04    (2006.01)
H04L 27/12    (2006.01)
H04L 27/20    (2006.01)

(52) U.S. Cl. .................................... 375/295
(58) Field of Classification Search ............. 375/295; 341/68, 53
See application file for complete search history.

(56) References Cited

U.S. PATENT DOCUMENTS

| | | | | |
|---|---|---|---|---|
| 4,049,909 A | 9/1977 | Peck | | 178/67 |
| 4,218,770 A | 8/1980 | Weller | | 375/118 |
| RE30,482 E | 1/1981 | Whitlock | | 360/32 |
| 4,408,166 A | 10/1983 | Moeller | | 329/106 |
| 4,592,072 A | 5/1986 | Stewart | | 375/55 |
| 4,641,323 A | 2/1987 | Tsang | | 375/80 |
| 4,686,484 A | 8/1987 | Otani | | 329/109 |
| 4,931,751 A | 6/1990 | Keller et al. | | 332/108 |
| 4,951,159 A | 8/1990 | Van Beek | | 358/455 |
| 5,027,372 A | 6/1991 | Wong | | 375/67 |
| 5,157,693 A | 10/1992 | Lemersal, Jr. et al. | | 375/67 |
| 5,175,549 A | 12/1992 | Back | | 341/152 |
| 5,202,643 A | 4/1993 | Sato | | 329/309 |
| 5,270,714 A | * 12/1993 | Tanaka et al. | | 341/59 |
| 5,379,323 A | 1/1995 | Nakaya | | 375/85 |
| 5,408,499 A | 4/1995 | Sasaki | | 375/286 |
| 5,428,321 A | 6/1995 | Yoshida et al. | | 332/109 |
| 5,442,664 A | 8/1995 | Rust et al. | | 375/371 |
| 5,506,873 A | 4/1996 | Suzuki | | 375/324 |
| 5,614,861 A | 3/1997 | Harada | | 329/308 |
| 5,625,645 A | 4/1997 | Greier et al. | | 375/276 |
| 5,627,500 A | 5/1997 | Wolaver et al. | | 332/112 |
| 5,652,552 A | 7/1997 | Chung | | 332/104 |
| 5,696,790 A | * 12/1997 | Graham et al. | | 375/238 |

(Continued)

Primary Examiner—Chieh M. Fan
Assistant Examiner—Jia Lu
(74) Attorney, Agent, or Firm—Schneck & Schneck; Thomas Schneck; Mark Protsik

(57) ABSTRACT

An dual phase pulse modulation (DPPM) encoder circuit converts data into a series of high and low signal pulses, each of whose time durations or pulse widths represents a group of M data bits, with the alternating high and low pulses representing successive groups. The encoder circuit may include a set of parallel-in, serial-out shift registers that subdivide received data words into the M-bit groups, a state machine that specified the pulse durations for each received group, e.g., by incrementing a state that indicates selected signal pulse transition times, a system clock delay chain with multiple taps, a multiplexer controlled by the state machine for successively selecting different taps, and a toggle flip-flop that is clocked by the multiplexer output.

10 Claims, 3 Drawing Sheets

U.S. PATENT DOCUMENTS

| | | | |
|---|---|---|---|
| 5,742,135 A * | 4/1998 | Horst | 375/354 |
| 5,841,816 A | 11/1998 | Dent et al. | 375/331 |
| 5,963,074 A | 10/1999 | Arkin | 327/276 |
| 5,977,821 A | 11/1999 | Shibata | 329/306 |
| 6,025,758 A | 2/2000 | Lu | 332/100 |
| 6,094,450 A | 7/2000 | Shockey | 375/141 |
| 6,115,428 A | 9/2000 | Kim | 375/308 |
| 6,204,726 B1 | 3/2001 | Toshinori | 329/304 |
| 6,255,866 B1 | 7/2001 | Wolaver et al. | 327/107 |
| 6,297,691 B1 | 10/2001 | Anderson et al. | 329/300 |
| 6,429,693 B1 | 8/2002 | Staszewski et al. | 327/12 |
| 6,439,679 B1 | 8/2002 | Roylance | 347/9 |
| 6,473,252 B1 * | 10/2002 | Graham | 360/40 |
| 6,778,491 B1 * | 8/2004 | Fourcand et al. | 370/217 |
| 2003/0035496 A1 | 2/2003 | Noda | 375/308 |
| 2003/0053521 A1 | 3/2003 | Huang et al. | 375/144 |
| 2003/0198478 A1 | 10/2003 | Vrazel et al. | 398/183 |

\* cited by examiner

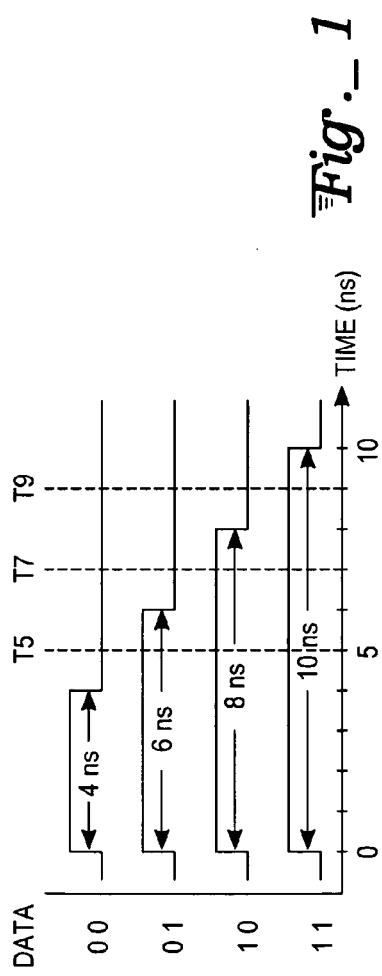
Fig._1
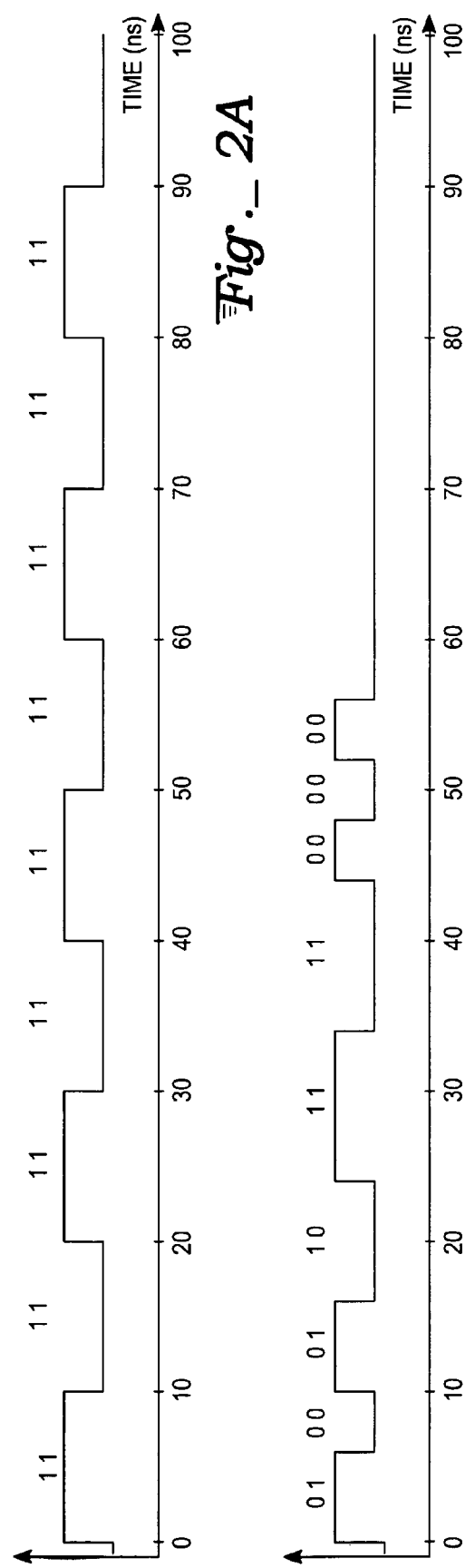
Fig._2A
Fig._2B

DUAL PHASE PULSE MODULATION ENCODER CIRCUIT

CROSS-REFERENCE TO RELATED APPLICATION

This application claims the benefit under 35 U.S.C. 119(e) from U.S. provisional application No. 60/510,738, filed on Oct. 10, 2003.

TECHNICAL FIELD

The present invention relates to modulation of digital data for signal transmission and corresponding demodulation of received signals to recover digital data carried thereby, and relates especially to the particular type of modulation used to encode the data, such as pulse-duration (width) modulation (PDM or PWM), on/off keying, non-return-to-zero (NRZ) schemes, differential phase-shift keying (DPSK), multiple-frequency-shift keying (MFSK), and various forms of multi-bit/N-ary encoding.

BACKGROUND ART

Communication signals are typically classified according to modulation type. Each of the various forms of modulation has its own set of advantages and disadvantages relative to a specific application for which it will be used. Some factors to consider in choosing a particular form of modulation include bandwidth, power consumption requirements, and the potential for signal propagation errors and recovery of the original information. For digital data, whether a separate clock signal is required or the modulated signal is self-clocking may be important. The relative simplicity or complexity of the modulating and demodulating equipment or circuitry may also be a factor in the decision. Low power consumption is particularly sought for use with capacitive-loaded transmission lines.

Each type of modulation has specialized encoder circuitry for performing the modulation. For example, U.S. Pat. No. 6,439,679 to Roylance discloses a pulse width modulator (PWM) circuit that includes a clock delay circuit with multiple taps, a tap selection circuit making a selection based on a pulse code input, and a transition generating circuit that generates the PWM output from the selected delayed clock. The pulse code input is interpreted by a timing instruction processing instruction circuit that generates a corresponding vector output that indicates when timing transitions associated with the PWM output should occur.

U.S. Pat. No. 5,442,664 to Rust et al. describes a modulator used for RF interference reduction that produces clock pulses with a series of different phase displacements by using a delay chain with a plurality of taps to provide various phase delays of a clock, an up/down counter serving as a selector module that sequentially renders active different ones of its output lines, and a multiplexer circuit made up of AND gates with one input receiving the various delayed clocks and another input receiving the selector output lines and OR gates propagating the selected delayed clock to the output.

DISCLOSURE OF THE INVENTION

The present invention is a dual phase pulse modulation (DPPM) encoder circuit that encodes data as a series of high and low signal pulses each of whose durations or "pulse widths" represent groups of M data bits. The encoder circuit includes means for receiving data words, means for subdividing the data words into an ordered sequence of groups of M data bits each, means for specifying successive time durations for each signal pulse based on the received groups, and means for producing alternately high and low signal pulses with the specified time durations. In particular, each of the possible $2^M$ data values of an M-bit group corresponds to a unique one of $2^M$ distinct time durations. The high signal pulses and the low signal pulses separately represent successive symbols.

More particularly, the encoder circuit may be implemented with a parallel data input bus supplying data words to a set of M parallel-in, serial-out shift registers that receive unique subsets of bits of the data and then synchronously shift out the M-bit groups of data bits to a state machine. The state machine may implement the specifying of successive time durations of the signal pulses by incrementing its state by an amount that corresponds to the duration for each received M-bit group, and outputting a control signal that indicates the selected signal pulse transition times. A delay chain circuit with a plurality of parallel taps provides a system clock with various delay times corresponding to possible pulse transition times. A multiplexer may select successive delayed system clocks according to the control signal from the state machine, with the multiplexer's selection triggering transitions of a toggle flip-flop whose output forms the generated DPPM signal.

DETAILED DESCRIPTION OF THE DRAWINGS

FIG. 1 is a graphic illustration (signal value versus time) of a set of DPPM pulses of various pulse durations for representing a corresponding set of dibit data symbols in accord with the present invention.

FIGS. 2a and 2b are graphical illustrations of DPPM pulse trains in accord with the present invention for a set of exemplary data, showing transmission of a series of 9 high and low going pulses within a single 100 ns system clock period.

BEST MODE FOR CARRYING OUT THE INVENTION

Figure 3:
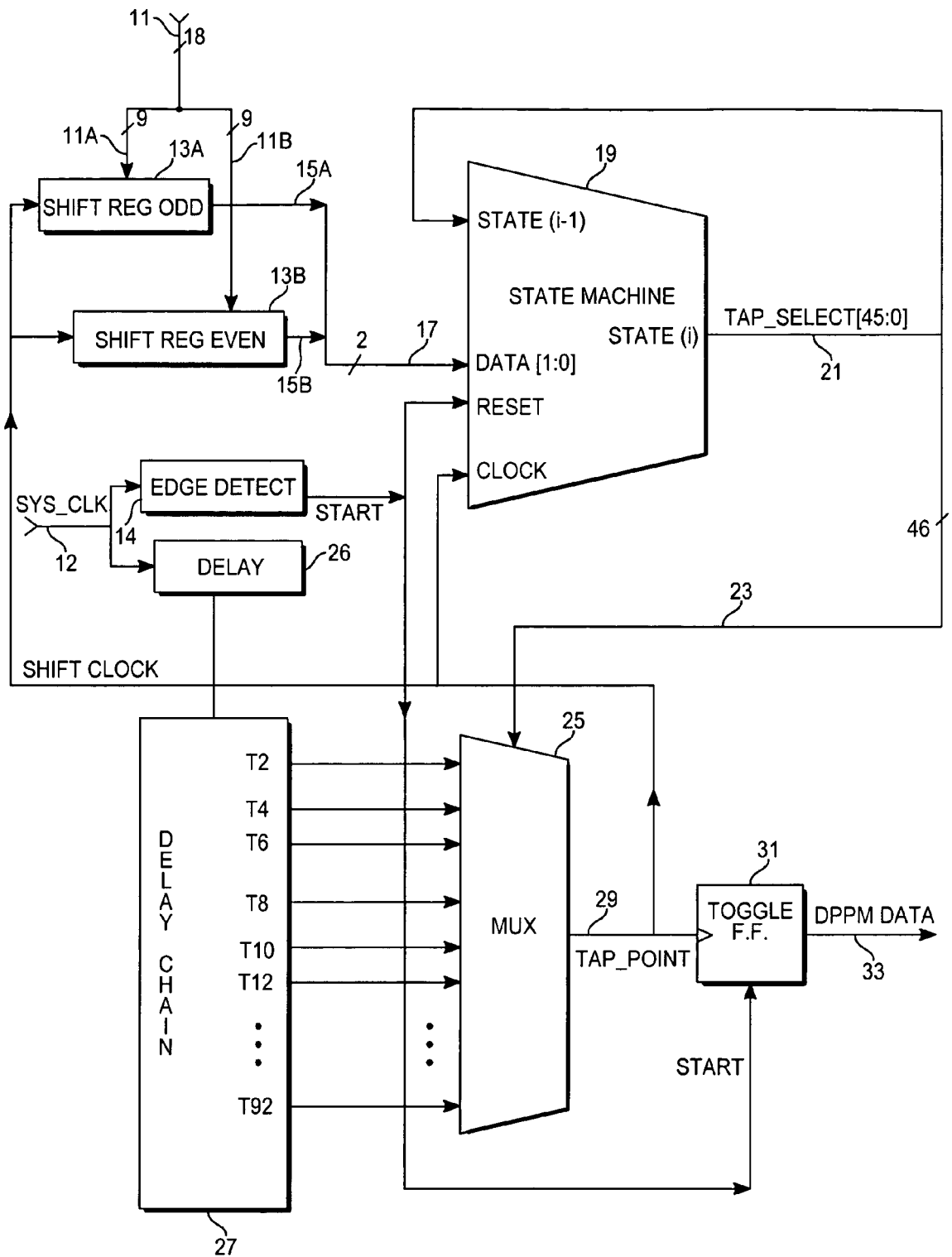
FIG. 3 is a schematic circuit diagram of an exemplary DPPM encoder circuit of the present invention.

The present invention is an encoder circuit (an embodiment of which is shown in FIG. 3) that carries out dual phase pulse modulation (DPPM). DPPM is a method of encoding data, resident in digital circuitry in the form of binary circuit states (ones and zeros), as a string of alternating high and low signal pulses whose respective durations or widths represent 2 (or more) bits of data per pulse. An exemplary embodiment shown in FIG. 1 uses 2 bits for encoding. The pairs of bits are encoded using a set of distinct pulse widths representing each possible dibit symbol value, such as:

00=4 ns pulse
01=6 ns pulse
10=8 ns pulse
11=10 ns pulse

The choice of 4, 6, 8, and 10 ns pulse widths is arbitrary and could just as well have been 4, 5, 6, and 7 ns or some other pulse widths, provided the decoding circuitry at the receiving end of a DPPM signal transmission can correctly distinguish the different pulse widths from each other. The decoding circuitry (as well as process variation, noise and signal degradation, and temperature/voltage variation in the propagating environment) also establishes a practical limit to the number of bits that can be encoded per pulse, with 3 bits per pulse having 8 ($=2^3$) possible pulse widths needing to be correctly resolved and 4 bits per pulse having 16 ($=2^4$) possible pulse widths needing to be correctly resolved. The data rate can be considered to be the number of encoded bits per second (or alternatively, the number of pulses per second) which depends on the number of pulses per system clock and on the system clock frequency.

"Dual Phase" refers to the fact that the information is sent as both the high-going pulses and the low-going pulses. Most pulse width modulation schemes simply vary the width of the high going pulse and therefore are really modulating the duty cycle. DPPM independently modulates the width of both high and low going pulses, with different groups of bits encoded in the high and low portions of each "cycle." Therefore, clock period and duty cycle are not valid concepts with respect to the generated pulse train. DPPM is by its nature "clockless," meaning the data can be decoded by simply detecting the width of the pulse with respect to each transition. This means that no clock need be sent with the data, nor must a clock be encoded and recovered from the data. This is a major advantage when transmitting time critical bursts between different chips, since it removes the necessity of manipulating a clock which would introduce opportunity for timing variance and error. The only clock consideration is the fact that several pulse "cycles" will be sent within each system clock period. For example, FIGS. 2a and 2b show examples of DPPM pulse trains of alternating high and low pulses (5 high pulses and 4 low pulses) transmitting 18 bits of data (organized here as 9 dibits) in a 100 ns system clock period. These 18 bits can form, for example, a 16-bit data word with two error correction code bits appended to the word. Thus one data word may be transmitted per system clock period.

Since information is sent on both positive and negative phases of the pulse train, DPPM is by its nature a non-return-to-zero (or non-return-to-one) modulation scheme. However, it is typically desired that the sequence of pulses contained within a system clock period return to zero (or one) at the end of each such sequence. This preference is most easily implemented when, as in the FIGS. 2a and 2b examples, the number of multi-bit symbols in a word to be represented as pulses is odd, since the final symbol in the sequence requires a return to zero (or return to one) as the trailing transition of the last pulse. However, this rule needn't be followed if an extra pulse is inserted by the encoder and ignored by the decoder to force a return.

Thus, the DPPM method represents groups of M data bits, such as dibits (M=2), as signal pulses of specified widths. Each of the $2^M$ possible data values corresponds to one of $2^M$ distinct pulse widths, and successive groups of M data bits are represented by signal pulses that are alternately high and low. Signal encoding and decoding circuitry performs the conversion between the data bit and signal pulse representations of the information content.

For encoding data bits as signal pulses, received data words are first subdivided into an ordered sequence of groups of M data bits, then each group in the sequence is converted into its corresponding signal pulse representation, thus producing a series of high and low signal pulses that represent the data. One way to perform the conversion of data words into signal pulses is to specify signal pulse transition times, each corresponding to a preceding transition time that is incremented by a specified pulse width corresponding to a present group of M data bits, and then producing signal pulse transitions at those specified transition times. The exemplary encoder hardware that is described below with reference to FIG. 3 performs the conversion in this way.

For decoding a DPPM signal back into data, the pulse width for each of the high and low signal pulses is determined, then converted back into an ordered sequence of groups of M data bits, and recombined into data words. One way to perform this conversion is carried out by the exemplary decoder hardware set forth in the following description with reference to FIG. 4.

An Encoder Circuit in Accord with the Present Invention:

With reference to FIG. 3, an exemplary DPPM encoder circuit of the present invention receives data words (e.g., 18 bits grouped into 9 dibits) on a parallel data input bus 11, here divided into two parts 11A and 11B. A load signal (not shown) indicates when data is available. If no data is available, the DPPM encoder is held idle. Sys_Clock 12 is a system clock that is also created externally to the DPPM encoder.

The circuit takes the received data on the odd and even data buses 11A and 11B and, synchronously to the system clock, loads it into two parallel-in, serial-out shift registers 13A and 13B. The odd bits (i.e., bits 1, 3, 5, 7, 9, 11, 13, 15, and 17) are loaded from bus lines 11A into the other shift register 13A (Shift Reg Odd). The even bits (i.e., bits 0, 2, 4, 6, 8, 10, 12, 14, and 16) are loaded from bus lines 11B into one shift register 13B (Shift Reg Even).

The contents of the registers are then serially shifted out in pairs 15A and 15B. A Shift Clock pulse fed from the multiplexer output 29 ensures that successive shifts of data out of the registers 13A and 13B are synchronized to the end of each DPPM signal pulse. In this way, the data words are subdivided into an ordered sequence of groups of M data bits each (here, M=2). If the data were to be divided instead into groups of three or four bits each, then the input bus 11 would typically be divided into three or four parts loading into three or four shift registers, each shift register providing one of the bits of each group on its serial output.

The register outputs 15A and 15B are connected to an input 17 to a state machine 19, whose N-bit output 21 is a function of its current value and the 2-bit pair to be encoded. In particular, the state machine 19 iteratively increments its state by an amount corresponding to the pulse widths for the successive 2-bit pairs received at state machine input 17. The N-bit output 21 has only one active bit and is used as an input 23 to control an multiplexer 25 for selecting the successive taps from the current-controlled delay chain 27. The multiplexer output 29 is used to clock a toggle flip-flop 31 and thus encode the data on its output 33 as a series of high and low pulses whose width represents the value of the 2-bit pair.

An edge detector circuit 14, which may be any known edge detector, issues a start pulse of 2 to 3 ns duration at each rising edge of the system clock, Sys_Clock. The start pulse resets the state machine 19 to a first tap selection state (tap_select[44:1]=0 and tap_select[0]=1). The start pulse also sets the toggle flip-flop 31 to its 'set' state (output high). A 1 ns pulse synchronous to the system clock is presented on input 12 to the start of a 92-element delay chain 27. A first delay element, shown separately, takes into account the time involved in loading the shift registers 13A and 13B and presenting the first pair of data bits to the state machine 19.

Each element in the delay chain 27 is here calibrated to have a 1 ns delay. Therefore, the pulse takes 92 ns to travel down the delay chain. Assuming that a first DPPM signal transition occurs at a time delay of 2 ns (corresponding to tap_select[0]), the delay chain's size corresponds to the maximum total time needed to represent a complete 18-bit word as a series of DPPM signal pulses, when using the set of pulse widths described above for FIG. 1. That is, a time duration of 90 ns is required to transmit nine "11" bit pairs as nine high and low signal pulses of 10 ns pulse width. If other word sizes and pulse width sets are chosen, the number of delay elements, and possibly even the amount of time delay per element, will change accordingly. The period of the system clock must exceed the total duration of a sequence of signal pulses when all are of the maximum pulse width. If a delay-locked loop (DLL) is used to calibrate the delay chain to the system clock, then pulse widths will be automatically scaled for different system clocks.

The least significant bits in the two shift registers 13A and 13B represent the current bit pair to be encoded and are input from lines 17 into a tap selector state machine 19. This state machine 19 selects a tap point for the 92-element delay chain 27. The pulse widths may be 4, 6, 8, or 10 ns for the four possible bit pairs, in which case the valid tap points are only on the even delay elements, so that there are 46 valid tap points in this implementation. (However, the choice of pulse widths is arbitrary and another set of pulse widths could be chosen. The choice of pulse widths is based on the need to provide enough separation such that the decoder can accurately distinguish between them. "Enough" is determined by factors such as desired noise/error margin, amount of noise in the system, and characteristics of the technology used, including process variation, switching speed, and setup/hold requirements.)

The tap point selection 21 is incremented based on the present tap point (STATE(i)) and the next 2-bit data (DATA [1:0]) to be encoded. The tap selects are preferably implemented as a one-shot state machine 19—essentially a shift register capable of multiple shifts per cycle—where a single active state is incremented by 2, 3, 4, or 5 positions on each clock, depending upon the 2-bit data value input from data lines 17. While requiring a register for every state is area-inefficient, this implementation allows for extremely fast switching of states and therefore quick control of the multiplexer 25. There is a one-to-one correspondence between the tap selection 21 that is output from the state machine 19 and the delay chain tap, T2 through T92, that is selected by the multiplexer 25. The timing is such that the tap point must increment to the next value before the rising edge propagating down the delay chain reaches the next tap point.

The tap point selection 21 is the selector control 23 for the multiplexer 25. The output 29 of the multiplexer 25 is a 1 ns pulse that occurs once at each selected tap point. This multiplexer output 29 clocks a toggle flip-flop 31 and also forms the Shift Clock pulse that shifts the data in the shift registers 13A and 13B and clocks the state machine 19 from one state to the next. The output 33 of the toggle flip-flop 31 is the DPPM output of the entire encoder circuit of FIG. 3.

Figure 4:
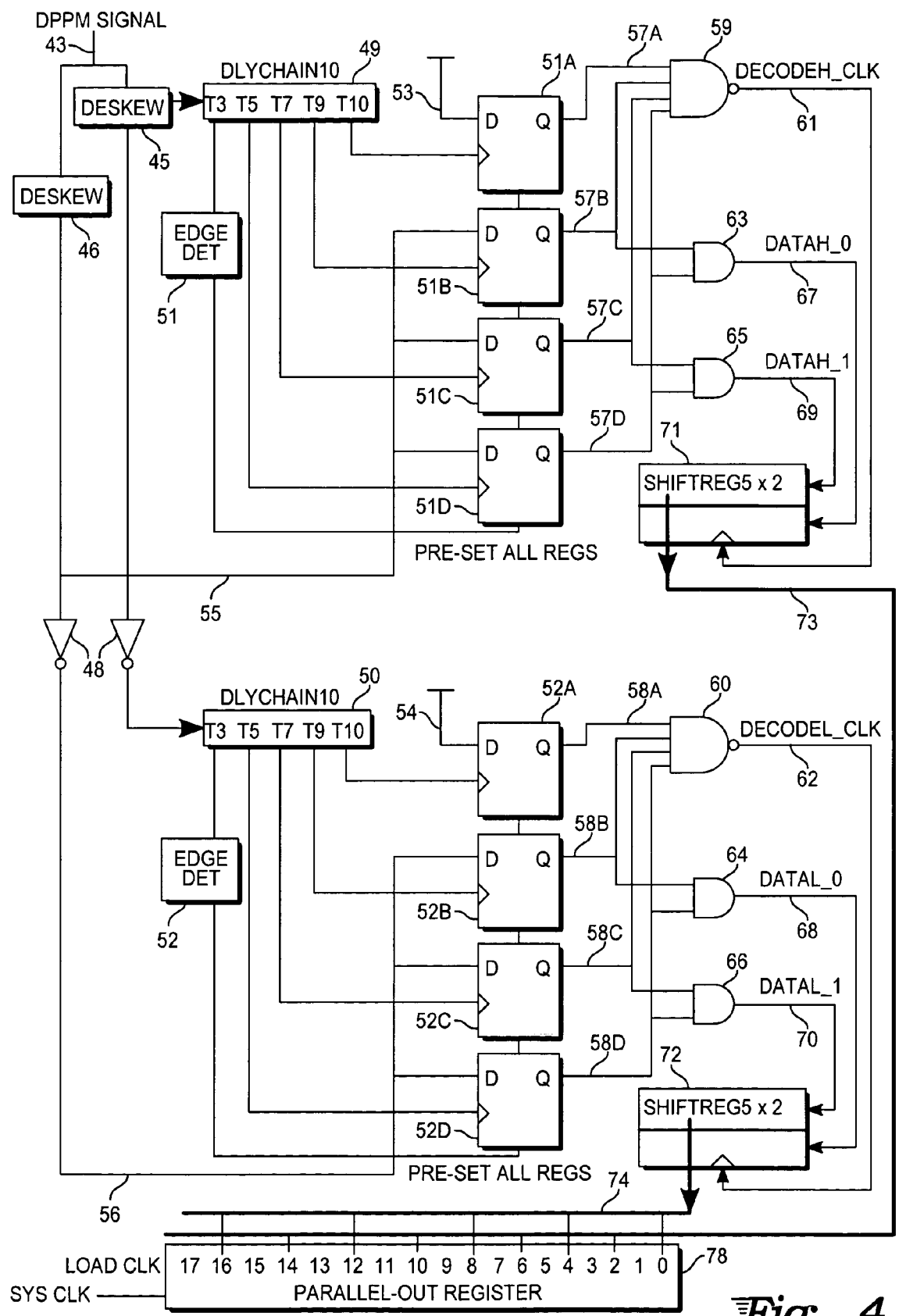
FIG. 4 is a schematic circuit diagram of an exemplary DPPM decoder circuit for use with DPPM signals that are generated by the encoder circuit of the present invention.

A Decoder Circuit for Use with the Present Invention:

With reference to FIG. 4, an exemplary DPPM decoder circuit processes serial DPPM signals received on an input 43 to obtain a parallel data output from an output register 78. Sys_Clock is a system clock that is created externally to the DPPM decoder. Deskew blocks 45 and 46 allow independent fine-tuning of delay on the DPPM signal that is used for clocking the D-flip-flops 51A–51D and 52A–52D and providing the data that is sampled by those same flip-flops. The amount of deskew may be controlled, for example, by a register (not shown) that tunes a venier circuit in each of the blocks 45 and 46. The high and low pulses are decoded separately. Inverters 48, coupled to the DPPM signal input 43 through the deskew blocks 45 and 46, invert the DPPM signal pulses so that substantially identical subcircuits can be used for decoding both the high and low pulses, as explained further below.

In general, the value of the data is determined by detecting the pulse widths with respect to the leading edge of each pulse. The modulated signal representing the data is piped through a short delay chain and outputs are used to clock and sample the non-delayed signal. As a result, the decoding requires no independent or recovered clock. More specifically, the serial-to-parallel DPPM data decoder includes two delay chains 49 and 50, each having K−1 outputs representing different stages of the delay chain, where K is the number of different delay values representing encoded data. For 2-bit encoding, K=4 (for 3-bit encoding, K=8, etc).

Returning to FIG. 1, for an implementation using 2-bit encoding, the data may be represented, for example, as 4, 6, 8, and 10 ns pulse widths. By sampling a pulse at times T5, T7, and T9 between the various possible trailing edge times for the different encoded pulse width values, the length of the pulse can be determined and then decoded back into its constituent pair of data bits. Thus, at a time T5 (i.e., 5 ns after the pulse leading edge), a 4 ns pulse encoding the dibit data value 00 will already have ended, whereas pulses encoding other dibit data values will not yet have transitioned at their trailing edge to the opposite signal state. Likewise, at time T7, a 6 ns pulse encoding data value 01 will also have ended, and later at time T9, an 8 ns pulse encoding data value 10 will have ended, but a 10 ns pulse encoding data value 11 will still continue for another nanosecond.

As seen in FIG. 4, the rising edge of a data pulse is sent through a first delay chain 49 and appears at T5, T7, and T9, which are used to clock a set of flip-flops 51B–51D and thus sample the data pulse presented on line 55. For low-going pulses, the incoming DPPM signal is first inverted, then sent through a second delay chain 50 that is used with another set of flip-flops 52B–52D to sample the inverted data pulse presented on line 56. High and low pulses are therefore independently decoded. Also, by using two delay chains with the low pulses inverted before sampling, it is possible to decode the DPPM signal using only rising edges traveling through the delay chains. This produces the added benefit of avoiding dispersion of rise/fall data pulses within the delay chain.

The logic AND gates 63–66 convert the sampled pulse values that are output from the flip-flops 51B–51D and 52B–52D on lines 57B–57D and 58B–58D into their corresponding data values.

It can be seen that dual phase pulse modulation (DPPM) allows pulse widths to be decoded with respect to the leading edges of pulses, and therefore does not require a clock. This means that no extra clock lines, clock encoding, or clock recovery circuits are required on the receiver. In fact, because delayed versions of the data pulses are actually used to clock (or sample) the incoming non-delayed data pulses, this decoding technique produces an added benefit of eliminating the possibility of introducing error when manipulating or recovering a clock.

What is claimed is:

1. A dual phase pulse modulation (DPPM) encoder circuit, comprising:
    input means for receiving data words;
    means for subdividing data words into an ordered sequence of groups of M data bits each;
    means, coupled to receive successive M-bit groups from the subdividing means, for specifying successive time durations corresponding to the received groups, each of a possible $2^M$ data values of an M-bit group corresponding to a unique one of $2^M$ distinct time durations, wherein the means for specifying successive time durations comprises a state machine configured to output a control signal onto a control bus that indicates selected signal pulse transition times relative to a transition of a system clock, said state machine being responsive to each successive received group of M data bits for incrementing the selected signal pulse transition times by an amount of the time duration corresponding to that received group; and
    signal generating means, configured to be controlled by said means for specifying successive time durations, for producing alternately high and low signal pulses having pulse durations that substantially match the specified time durations.

2. The DPPM encoder circuit as in claim 1, wherein said input means comprises a parallel data input bus.

3. A dual phase pulse modulation (DPPM) encoder circuit, comprising:
    input means for receiving data words;
    means for subdividing data words into an ordered sequence of groups of M data bits each, wherein said subdividing means comprises a set of M parallel-in, serial-out shift registers, each shift register receiving a unique subset of bits of the data words from the input means, each shift register receiving every M-th bit of the ordered sequence, the set of shift registers synchronously shifting out the groups of M data bits;
    means, coupled to receive successive M-bit groups from the subdividing means, for specifying successive time durations corresponding to the received groups, each of a possible $2^M$ data values of an M-bit group corresponding to a unique one of $2^M$ distinct time durations; and
    signal generating means, configured to be controlled by said means for specifying successive time durations, for producing alternately high and low signal pulses having pulse durations that substantially match the specified time durations.

4. The DPPM encoder circuit as in claim 1, wherein the signal generating means comprises:
    a delay chain circuit having a serial input coupled to receive the system clock and having a plurality of parallel taps providing the system clock after a plurality of delay times corresponding to a set of possible signal pulse transition times;
    means, coupled to the control bus and responsive to the control signal, for selecting the delayed system clock of said delay chain taps and providing the selected delayed system clock on an output thereof; and
    a toggle flip-flop having a clock input connected to the output of the selecting means and having an output on which the alternately high and low signal pulses of the encoder circuit are produced.

5. The DPPM encoder circuit is in claim 4, wherein the delay chain circuit is coupled to a delay-locked loop (DLL) constructed to calibrate the delay times of each element of the delay chain circuit relative to a period of the system clock.

6. A dual phase pulse modulation (DPPM) encoder circuit, comprising:
    a parallel data input for receiving a data word divisible into an ordered sequence of groups of M data bits each;
    a plurality, M, of shift registers coupled to receive the data word from the parallel data input, each shift register dedicated to a different data bit in each of the groups, the received data bits being shifted synchronously out of the plurality of shift registers as said ordered sequence of groups via a shift clock input to all of the shift registers;
    a state machine coupled to receive an M-bit group from the shift registers, the state machine configured to increment a delay value by a specified time period corresponding to the received group and to provide the delay value as a tap select signal on an output of the state machine;
    a multi-element delay chain coupled to receive a system clock and configured to propagate the leading edge of the system clock to a plurality of taps of the delay chain;
    a multiplexer having inputs to receive all of the taps from the delay chain, a control input coupled to receive the tap select signal from the state machine output for selecting one of the taps of the delay chain, and an output configured to provide a delayed system clock edge from the selected tap; and
    a toggle flip-flop having a clock input coupled to receive the delayed system clock edge from the multiplexer output and having an output configured to provide a series of alternating high and low signal pulses of specified pulse widths corresponding to the selected taps and therefore corresponding to the ordered sequence of M-bit groups of data bits of the data word.

7. The DPPM encoder circuit as in claim 6, wherein the multi-element delay chain is coupled to a delay-locked loop (DLL) constructed to calibrate the delay through each element of the chain relative to a period of the system clock.

8. A DPPM encoder circuit as in claim 6 wherein M=2 and the groups are pairs of data bits, each combination of bits corresponding to one of four distinct pulse widths.

9. A method of operating a dual phase pulse modulation (DPPM) encoder circuit to convert data into a string of signal pulses, comprising:
    receiving data words into the encoder circuit and subdividing the data words into an ordered sequence of groups of M data bits each;
    specifying successive time durations in accord with data values for each of the groups of data bits in the ordered sequence, each of a possible $2^M$ data values of an M-bit group corresponding to a unique one of $2^M$ distinct time durations, wherein specifying successive time durations comprises incrementing a pulse transition time relative to a transition of a system clock by amounts corresponding to the data values of each the groups of data bits and providing a select control signal that successively represents each pulse transition time obtained from the incrementing; and
    triggering successive signal pulse transitions after each of the successive time durations so as to produce a string of alternately high and low signal pulses having pulse durations that substantially match the time durations corresponding to the ordered sequence of data bits obtained from the received data words, wherein triggering successive signal pulse transitions comprises:

delaying the system clock in a delay chain circuit and providing a plurality of delayed system clock outputs with specified delay times;

successively selecting delayed system clock outputs using the select control signal; and toggling an output signal using the successive selected delay system clock outputs as a trigger.

10. A method of operating a dual phase pulse modulation (DPPM) encoder circuit to convert data into a string of signal pulses, comprising:

receiving data words into the encoder circuit and subdividing the data words into an ordered sequence of groups of M data bits each, wherein receiving and subdividing the data words comprises inputting data bits from a data bus into a set of M parallel-in, serial-out shift registers, each shift register receiving a unique subset of the data bits corresponding to every M-th bit of the ordered sequence and synchronously shifting out the groups of M data bits from the set of shift registers;

specifying successive time durations in accord with data values for each of the groups of data bits in the ordered sequence, each of a possible $2^M$ data values of an M-bit group corresponding to a unique one of $2^M$ distinct time durations; and triggering successive signal pulse transitions after each of the successive time durations so as to produce a string of alternately high and low signal pulses having pulse durations that substantially match the time durations corresponding to the ordered sequence of data bits obtained from the received data words.

* * * * *